United States Patent
Dix et al.

(10) Patent No.: US 9,634,135 B2
(45) Date of Patent: Apr. 25, 2017

(54) POWER FIELD EFFECT TRANSISTOR

(71) Applicant: Microchip Technology Incorporated, Chandler, AZ (US)

(72) Inventors: Greg A. Dix, Tempe, AZ (US); Dan Grimm, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 13/778,301

(22) Filed: Feb. 27, 2013

(65) Prior Publication Data

US 2013/0228854 A1    Sep. 5, 2013

Related U.S. Application Data

(60) Provisional application No. 61/605,989, filed on Mar. 2, 2012.

(51) Int. Cl.
*H01L 29/778*  (2006.01)
*H01L 29/78*   (2006.01)
(Continued)

(52) U.S. Cl.
CPC .... *H01L 29/7809* (2013.01); *H01L 29/41766* (2013.01); *H01L 29/0878* (2013.01); *H01L 29/456* (2013.01); *H01L 2924/0002* (2013.01)

(58) Field of Classification Search
CPC ........... H01L 27/11582; H01L 29/7809; H01L 29/7816; H01L 29/7835; H01L 29/41741; H01L 29/41766; H01L 29/66787
(Continued)

(56) References Cited

U.S. PATENT DOCUMENTS 5,635,742 A   6/1997  Hoshi et al. ............ 257/337
6,753,575 B2* 6/2004  Efland et al. ........... 257/343
(Continued)

FOREIGN PATENT DOCUMENTS

JP    6151863 A    5/1994  ......... H01L 29/739
JP    7326742 A   12/1995  ......... H01L 21/8222

OTHER PUBLICATIONS

Taylor, Brian et al., "The IR8200 Monolithic DMOS H-Bridge Power Control IC," Electronic Engineering, vol. 61, No. 745, 4 pages, Jan. 1989.
(Continued)

*Primary Examiner* — Cheung Lee
*Assistant Examiner* — Stephen C Smith
(74) *Attorney, Agent, or Firm* — Slayden Grubert Beard PLLC

(57) ABSTRACT

A field-effect transistors (FET) cell structure has a substrate, an epitaxial layer of a first conductivity type on the substrate, first and second base regions of the second conductivity type arranged within the epitaxial layer or well and spaced apart, and first and second source regions of a first conductivity type arranged within the first and second base region, respectively. Furthermore, a gate structure insulated from the epitaxial layer by an insulation layer is provided and arranged above the region between the first and second base regions and covering at least partly the first and second base region, and a drain contact reaches from a top of the device through the epitaxial layer to couple a top contact or metal layer with the substrate.

23 Claims, 5 Drawing Sheets

(51) Int. Cl.
H01L 29/417 (2006.01)
*H01L 29/45* (2006.01)
*H01L 29/08* (2006.01)

(58) Field of Classification Search
USPC .................................................. 255/288, 355
See application file for complete search history.

(56) References Cited

U.S. PATENT DOCUMENTS

| | | | | |
|---|---|---|---|---|
| 6,878,998 | B1* | 4/2005 | Terashima | 257/343 |
| 7,235,845 | B2* | 6/2007 | Xu | H01L 29/402 |
| | | | | 257/336 |
| 7,417,298 | B2* | 8/2008 | Depetro et al. | 257/510 |
| 7,482,645 | B2* | 1/2009 | Wu et al. | 257/288 |
| 8,278,712 | B2* | 10/2012 | Kao | H01L 27/088 |
| | | | | 257/343 |
| 8,304,825 | B2* | 11/2012 | Garnett | H01L 29/41766 |
| | | | | 257/302 |
| 8,653,587 | B2* | 2/2014 | Hsieh | 257/330 |
| 2002/0017683 | A1* | 2/2002 | Jeon | 257/339 |
| 2007/0034944 | A1* | 2/2007 | Xu | H01L 29/402 |
| | | | | 257/335 |
| 2012/0068231 | A1* | 3/2012 | Garnett | H01L 29/41766 |
| | | | | 257/263 |
| 2012/0248528 | A1* | 10/2012 | Wilson et al. | 257/330 |
| 2014/0103398 | A1* | 4/2014 | Curatola | H01L 29/4175 |
| | | | | 257/194 |
| 2014/0167144 | A1* | 6/2014 | Tsuchiko | H01L 21/823418 |
| | | | | 257/329 |

OTHER PUBLICATIONS

International Search Report and Written Opinion, Application No. PCT/US2013/028154, 13 pages, Jun. 17, 2013.
Taiwan Office Action, Application No. 102107391, 12 pages, Oct. 19, 2016.
Chinese Office Action, Application No. 201380022263.6, 16 pages, Jul. 5, 2016.

* cited by examiner

POWER FIELD EFFECT TRANSISTOR

CROSS-REFERENCE TO RELATED APPLICATIONS

This application claims the benefit of U.S. Provisional Application No. 61/605,989 filed on Mar. 2, 2012, which is incorporated herein in its entirety.

TECHNICAL FIELD

The present disclosure relates to power field effect transistors (FET) in particular, power FETs which can be integrated in integrated circuit devices.

BACKGROUND

Power FETs are well known in the art. A low on-resistance of the load path between source and drain is one of the most important variables of such devices. To achieve a low resistance, such devices are often designed as vertical transistors wherein the source of the FET is implemented and can be contacted by a metal layer on the top surface of the device and the backside comprises a metal layer that connects to the drain of the FET.

It is desirable to provide for a FET device that only provides for frontside contacts of the FET product.

SUMMARY

According to various embodiment, a FET product can be designed to only have frontside contacts by creating a drain contact that will contact as close to the highly doped substrate as possible to eliminate extra series resistance in a FET device with frontside only connections.

According to a specific embodiment, a field-effect transistors (FET) cell structure may comprise a substrate, an epitaxial layer of a first conductivity type on the substrate, first and second base regions of the second conductivity type arranged within the epitaxial layer or well and spaced apart, first and second source regions of a first conductivity type arranged within the first and second base region, respectively, a gate structure insulated from the epitaxial layer by an insulation layer and arranged above the region between the first and second base regions and covering at least partly the first and second base region, and a drain contact reaching from a top of the device through the epitaxial layer to couple a top contact or metal layer with the substrate.

According to a further embodiment, the drain contact may reach into the substrate. According to a further embodiment, the drain contact can be coupled with the substrate through an implant connecting the drain contact with the substrate. According to a further embodiment, the implant can be a buried layer and may be a phosphorus implant. According to a further embodiment, the drain contact can be formed by a drain hole etched into the epitaxial layer filled with a conducting material which can be Tungsten. According to a further embodiment, the drain hole can be etched through the epitaxial layer and an oxide layer formed on top of the epitaxial layer. According to a further embodiment, the drain contact can be formed by a drain trench etched into the epitaxial layer filled with a conducting material which may be Tungsten.

According to another embodiment, a power field effect transistor (FET) may comprise a substrate, an epitaxial layer of a first conductivity type on the substrate, a plurality of first and second base regions of the second conductivity type arranged within the epitaxial layer or well and spaced apart, a plurality of first and second source regions of a first conductivity type arranged within the first and second base region, respectively, a plurality of gate structures insulated from the epitaxial layer by an insulation layer and arranged above the region between respective first and second base regions and covering at least partly respective first and second base regions, and at least one drain contact reaching from a top of the device through the epitaxial layer to couple a top contact or metal layer with the substrate.

According to a further embodiment of the power FET, the power FET may comprise a single drain contact associated with a plurality of the first and second source regions. According to a further embodiment of the power FET, a plurality of drain contacts can be provided and a predefined ratio of a number of first and second source regions and to a respective drain contact may be given. According to a further embodiment of the power FET, a plurality of drain contacts can be provided and wherein the ratio >1. According to a further embodiment of the power FET, the drain contact may reach into the substrate. According to a further embodiment of the power FET, the drain contact can be coupled with the substrate through an implant connecting the drain contact with the substrate. According to a further embodiment of the power FET, the implant can be a buried layer. According to a further embodiment of the power FET, the drain contact can be formed by a drain hole etched into the epitaxial layer filled with a conducting material. According to a further embodiment of the power FET, the drain hole can be etched through the epitaxial layer and an oxide layer can be formed on top of the epitaxial layer. According to a further embodiment of the power FET, the drain contact can be formed by a drain trench etched into the epitaxial layer filled with a conducting material.

According to yet another embodiment, an integrated circuit device may comprise a control circuit operable to generate a plurality of control signals, at least one integrated power field effect transistor (FET) having a source, drain and a gate which is coupled with the control circuit to receive a respective control signal and which comprises a substrate; an epitaxial layer of a first conductivity type on the substrate; a plurality of first and second base regions of the second conductivity type arranged within the epitaxial layer or well and spaced apart; a plurality of first and second source regions of a first conductivity type to form the source and arranged within the first and second base region, respectively; a plurality of gate structures to form the gate and insulated from the epitaxial layer by an insulation layer and arranged above the region between respective first and second base regions and covering at least partly respective first and second base regions, and at least one drain contact reaching from a top of the device through the epitaxial layer to couple a top contact or metal layer with the substrate.

DETAILED DESCRIPTION

Figure 1:
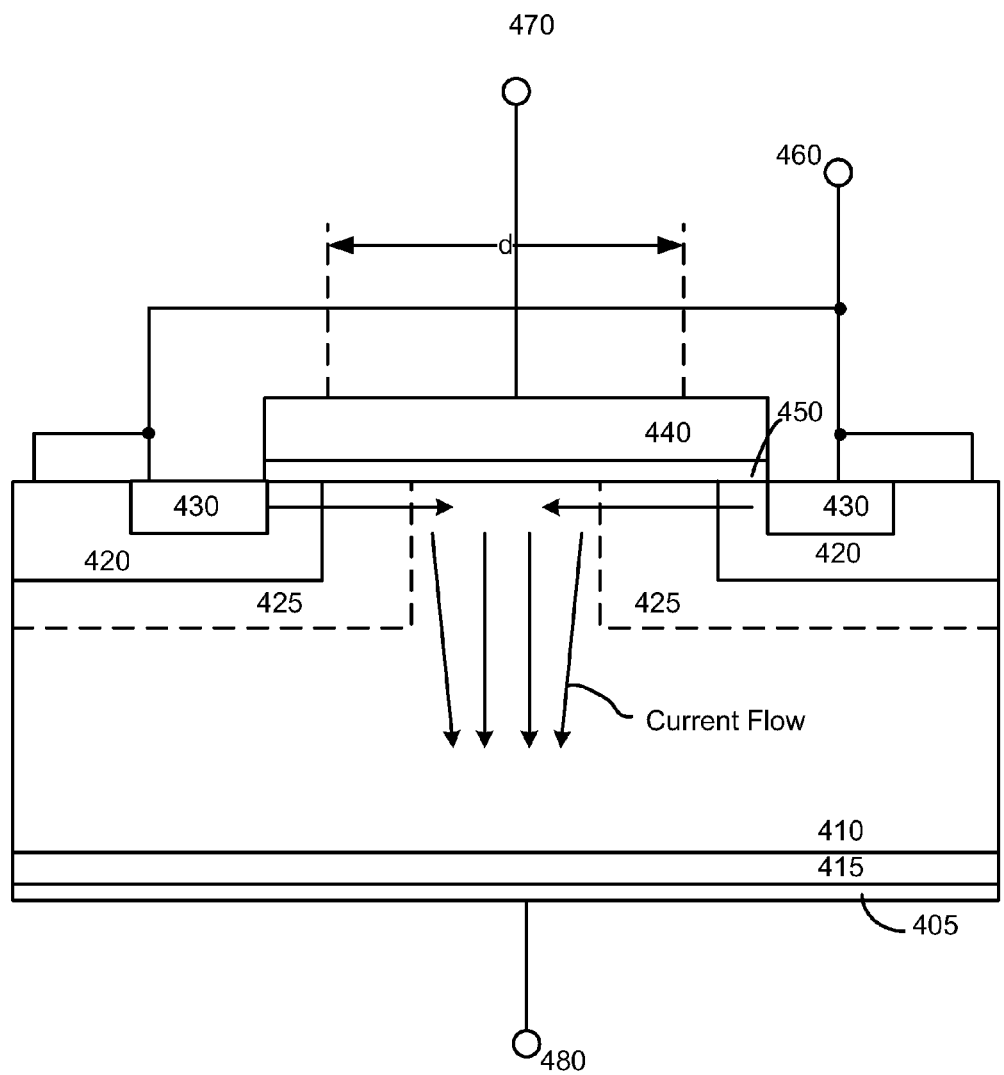
FIG. 1 shows a conventional vertical power MOSFET.

According to various embodiments, a drain contact may be designed to link the frontside of the device to the highly doped substrate $N^{+++}$ with a low resistance W plug.

According to various embodiments, a field-effect transistors (FET) cell structure may comprise a substrate, an epitaxial layer of a first conductivity type on said substrate, first and second base regions of the second conductivity type arranged within said epitaxial layer or well and spaced apart, first and second source regions of a first conductivity type arranged within said first and second base region, respectively, a gate structure insulated from said epitaxial layer by an insulation layer and arranged above the region between the first and second base regions and covering at least partly said first and second base region, and a drain contact reaching from a top of the device through the epitaxial layer to couple a top contact or metal layer with said substrate.

According to a further embodiment, the drain contact may connect to the substrate. According to a further embodiment, the drain contact may be coupled with the substrate through an implant connecting the drain contact with the substrate. According to a further embodiment, the drain contact can be formed by a drain hole etched into the epitaxial layer filled with a conducting material. According to a further embodiment, the drain hole can be etched through the epitaxial layer and an oxide layer formed on top of the epitaxial layer.

According to another embodiment, a power field effect transistor (FET) may comprise a substrate, an epitaxial layer of a first conductivity type on said substrate, a plurality of first and second base regions of the second conductivity type arranged within said epitaxial layer or well and spaced apart, a plurality of first and second source regions of a first conductivity type arranged within said first and second base region, respectively, a plurality of gate structures insulated from said epitaxial layer by an insulation layer and arranged above the region between respective first and second base regions and covering at least partly respective first and second base regions, and a drain contact reaching from a top of the device through the epitaxial layer to couple a top contact or metal layer with said substrate.

According to a further embodiment of the power FET a single drain contact may be associated with a plurality of said first and second source regions. According to a further embodiment, the drain contact may connect to the substrate. According to a further embodiment, the drain contact can be coupled with the substrate through an implant connecting the drain contact with the substrate. According to a further embodiment, the drain contact can be formed by a drain hole etched into the epitaxial layer filled with a conducting material. According to a further embodiment, the drain hole can be etched through the epitaxial layer and an oxide layer formed on top of the epitaxial layer.

As shown for example, in FIG. 1, on an N+ substrate 415 there is a N− epitaxial layer formed whose thickness and doping generally determines the voltage rating of the device. From the top into the epitaxial layer 410 there are formed N+ doped left and right source regions 430 surrounded by P-doped region 420 which forms the P-base surrounded by its out diffusion area 425. A source contact 460 generally contacts both regions 430 and 420 on the surface of the die and is generally formed by a metal layer that connects both left and right source region. An insulating layer 450, typically silicon dioxide or any other suitable material, insulates a polysilicon gate 440 which covers a part of the P-base region 420 and out diffusion area 425. The gate 440 is connected to a gate contact 470 which is usually formed by another metal layer. The bottom side of this vertical transistor has another metal layer 405 forming the drain contact 480. The backside of the dice comprises the drain contact layer 405 and associated drain contact 480. In summary, FIG. 1 shows a typical elementary cell of a MOSFET that can be very small and comprises a common drain, a common gate and two source regions and two channels. Other similar cells may be used in a vertical power MOS-FET.

Figure 2:
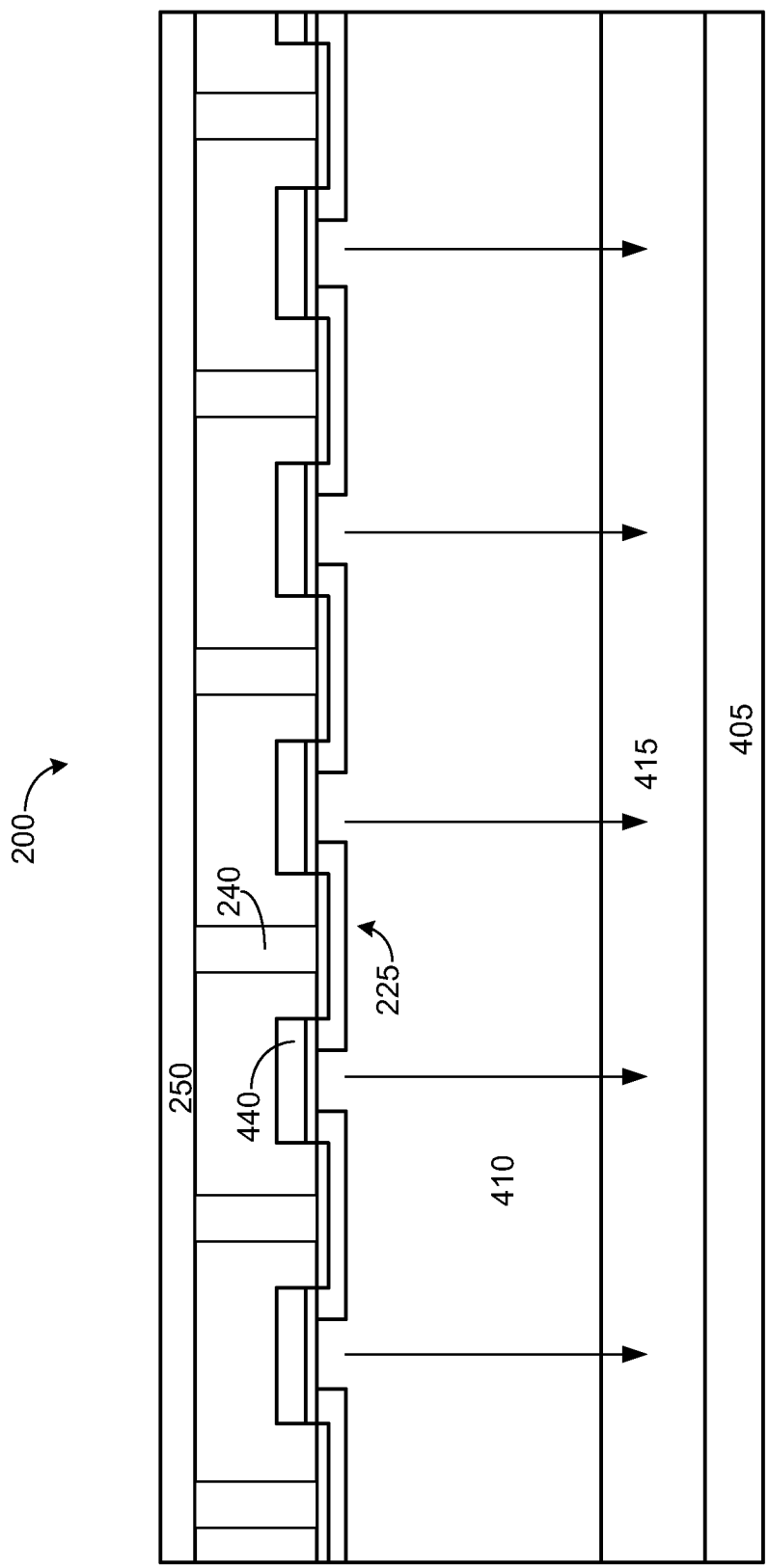
FIG. 2 shows another conventional vertical power MOSFET.

A plurality of such cells may generally be connected in parallel to form a power MOSFET 200 as shown in FIG. 2. Here, source regions 125 similar to those shown in FIG. 1 are arranged in parallel to form respective cells which are connected through a plurality of vias 240 with a metal layer 250.

In the On-state, a channel is formed within the area of regions 420 and 425 covered by the gate 440; reaching from the surface into the regions 420 and 425, respectively. Thus, current can flow as indicated by the horizontal arrow in FIG. 1. The cell structure provides for a sufficient width between the adjacent source regions to allow for this current to turn into a vertical current flowing to the drain side as indicated by the vertical arrows in FIGS. 1 and 2.

Figure 3:
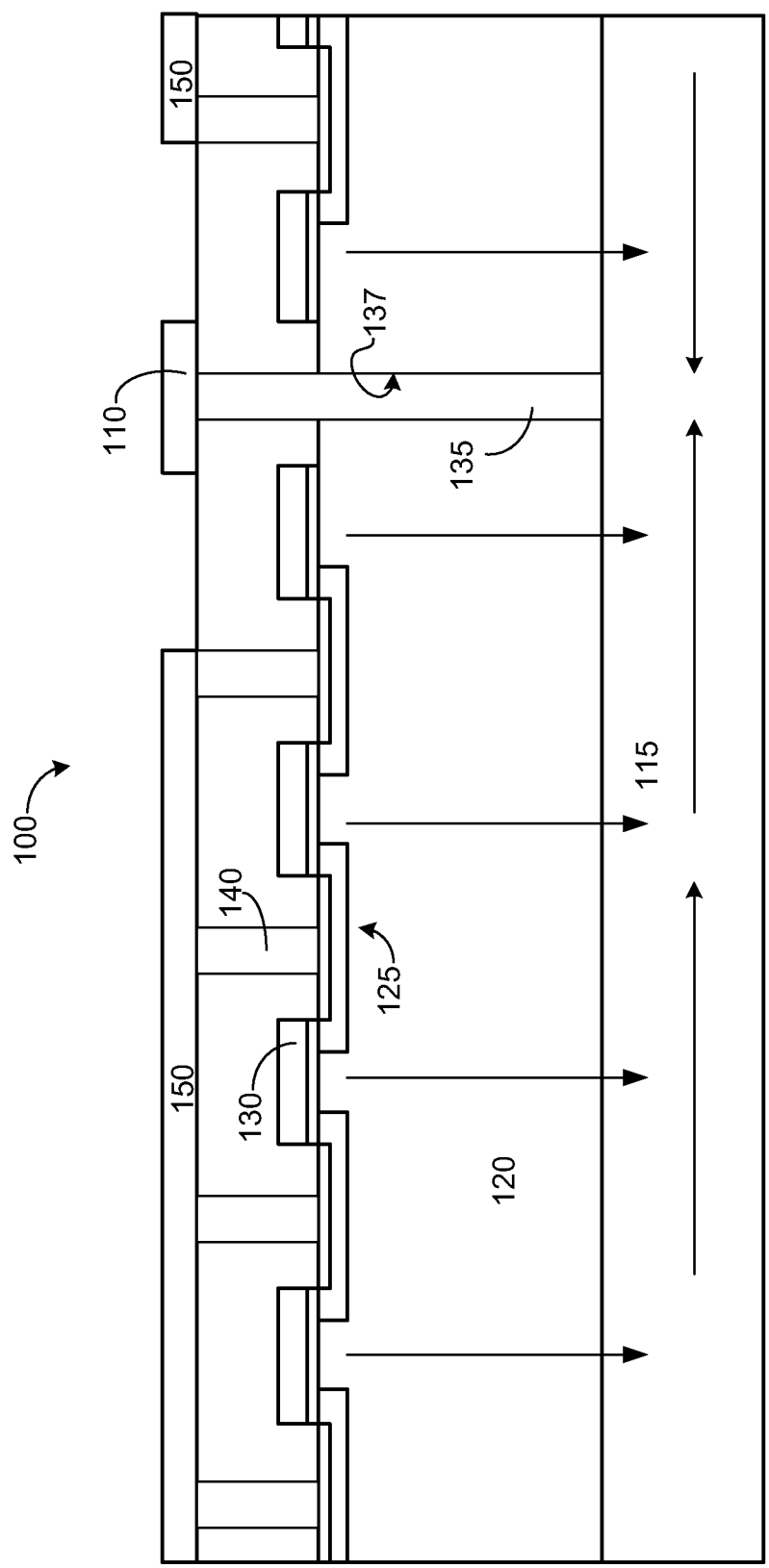
FIG. 3 shows a first embodiment of a power field effect transistor according to various embodiments.

According to various embodiments, as for example shown in FIG. 3, a highly doped substrate 115, for example $N^{+++}$ doped, is provided on which a $N^-$ doped epitaxial layer 120 has been grown. The device 100 is similar to the device shown in FIG. 2 with a plurality of source regions 125 that are connected to a metal layer 150 through vias 140. However, as shown in FIG. 3 in the sectional view one of the source regions 125 has been left off to provide space for a connection hole 137 provided to allow a frontside connection of the drain. A drain contact area 110 can be provided on the frontside or top surface of the device 100 wherein a drain connection is created that is etched into the silicon as close as possible to the highly doped substrate 115. Thus, for example, a hole 137 can be etched into the $N^-$ doped epitaxial layer 120 that reaches to the surface or into the highly doped substrate 115 thereby connecting the top drain contact area 110 with the highly doped substrate 115. To this end, the metal layer 150 may be patterned as shown in FIG. 3 to allow for a placement of a respective drain metallization. The etched hole or bore can be filled with a conducting material 135 such as Tungsten or any suitable metal.

FIG. 3 shows a sectional view with a single drain connection. However, a plurality of such connection may be arranged within the semiconductor die. Furthermore, instead of a bore 137 a trench may be etched that allows for an even lower resistance connection. The trench may be extended or a plurality of bores 137 may be provided to encircle a plurality of source cells. Also the number of drain connections may match or be in a predefined ratio to the number of source connections 140. Hence, the placement and number of the drain connection can be widely varied according to various embodiments and design specifications.

Figure 4:
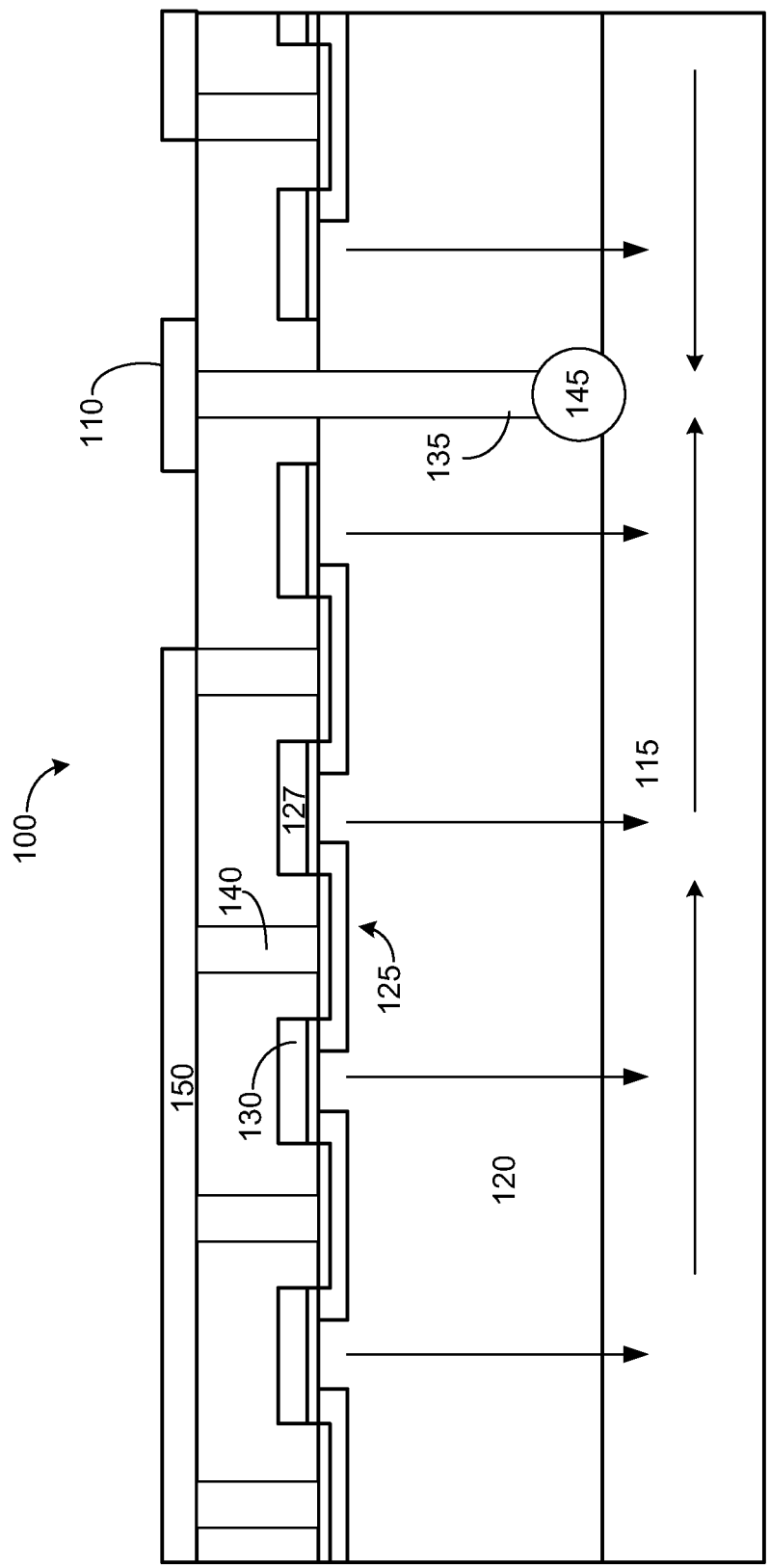
FIG. 4 shows a second embodiment of a power field effect transistor according to various embodiments.

According to another embodiment, as shown in FIG. 4, an implant 145, such as e.g. a phosphorus implant, can be added into the drain "hole" to lower the resistance if the epitaxial layer thickness is too large to completely etch through thus linking the $N^{+++}$ substrate 115 to the Drain contact. Implant 145 may be a buried layer as shown in FIG. 4. Even though shown as a circle or sphere, it may have different expansion values in horizontal and vertical direction. For example, to provide for a shorter etching distance, the vertical extension may be larger than the horizontal extension.

In a power transistor with a plurality of source-gate-source cells as shown in FIGS. 3 and 4, two adjacent base-source structures may not be covered by a gate and instead the drain contact may be placed between the two structures as shown in FIGS. 3 and 4. The drain contact may be formed by a hole 137 that reaches through the top oxide layer and the epitaxial layer 120 as shown in FIGS. 3 and 4 thereby connecting a top metal layer 110 for the drain with the substrate 115.

Thus, according to various embodiments, a method is enabled for a front side only Power FET. By reducing the extra series resistance to the N$^{+++}$ substrate 115, the substrate can be used to carry current and therefore only 1 drain contact may be needed for several source contacts. In addition the "pitch" of the device is improved and this also yields to a better silicon efficiency.

Figure 5A:
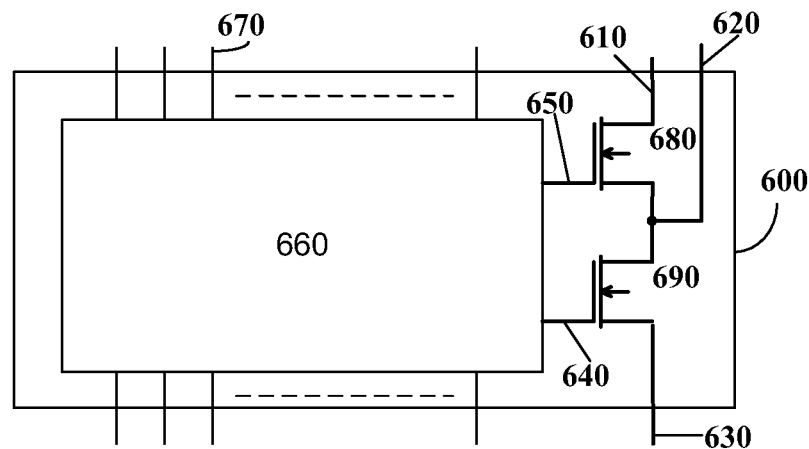
FIGS. 5A and 5B show power transistors according to various embodiments embedded in an integrated circuit.
Figure 5B:
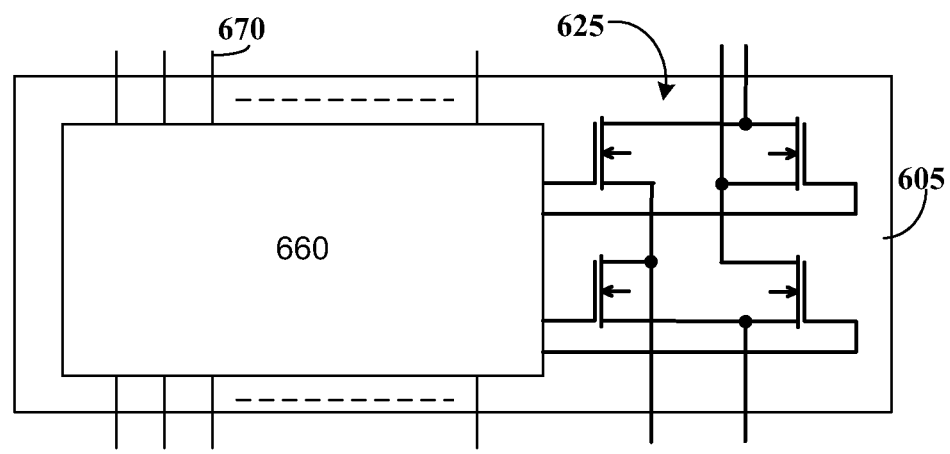

The cell structure or a plurality of cells can be used to form a power DMOS-FET within an integrated circuit or in a discrete transistor device as shown in FIGS. 5A and 5B. Such an integrated circuit may provide control circuits for use in a switched mode power supply. Thus, no external power transistors may be necessary.

FIG. 5A shows schematically how a microcontroller 660 can be combined with two power transistors 680 and 690 according to various embodiments as shown in FIGS. 3-4 on a single chip 600. Alternatively, the microcontroller 660 and the transistors 680, 690 may be provided on separate chips within a single housing. Microcontroller 660 may have a plurality of peripheral devices such as controllable drivers, modulators, in particular pulse width modulators, timers etc. and is capable to drive the gates 640 and 650 of transistors 680 and 690 directly or through respective additional drivers. The chip 600 can be configured to make a plurality of functions of the microcontroller available through external connections or pins 670. The source of first transistor 680 can be connected to external connection or pin 610. Similarly, external connection 620 provides a connection to the combined drain and source of transistors 680 and 690 and external connection or pin 630 for the drain of the second transistor 630. Other transistor structures manufactured in accordance with the various embodiments disclosed can be used, such as an H-bridge or multiple single transistors. FIG. 5B shows an exemplary plurality of MOSFETs connected to form an H-Bridge 625 that can be coupled with a microcontroller 660 or modulator within a single semiconductor chip 605.

Furthermore, the exemplary embodiments show an N-channel device with appropriate conductivity types of the different regions. A person skilled in the art will appreciate that the embodiments of the present application are not restricted to N-channel devices but can be also applied to P-Channel devices.

What is claimed is:

1. A field-effect transistors (FET) cell structure comprising:
a substrate being highly doped and being of a first conductivity type and forming a drain of the FET;
an epitaxial layer of the first conductivity type on said substrate;
first and second base regions of a second conductivity type arranged within said epitaxial layer and spaced apart;
first and second source regions of a first conductivity type arranged within said first and second base region, respectively;
a gate structure insulated from said epitaxial layer by an insulation layer and arranged above the region between the first and second base regions and covering at least partly said first and second base region,
a drain contact via structure reaching from a top of the device into the epitaxial layer and being located in an area where the epitaxial layer extends from the substrate to the top of the device, wherein a bottom end of the drain contact via structure which is located within the epitaxial layer is coupled with the substrate through an implant connecting only the epitaxial layer and the bottom region of the drain contact via structure with the substrate, wherein the implant starts within a bottom region of the epitaxial layer and extends vertically into said substrate in the area of the drain contact and only connects with the bottom end of the drain contact via structure, the substrate and the epitaxial layer.

2. The field effect transistor cell structure according to claim 1, wherein the implant reaches into the bottom region of the drain contact via structure.

3. The field effect transistor cell structure according to claim 1, wherein a vertical extension of the implant is larger than its horizontal extension.

4. The field effect transistor cell structure according to claim 1, wherein the implant is a buried layer.

5. The field effect transistor cell structure according to claim 1, wherein the implant is a phosphorus implant.

6. The field effect transistor cell structure according to claim 1, wherein the drain contact via structure is formed by a drain hole etched into the epitaxial layer filled with a conducting material.

7. The field effect transistor cell structure according to claim 6, wherein the conducting material is Tungsten.

8. The field effect transistor cell structure according to claim 6, wherein the drain hole is etched through the epitaxial layer and an oxide layer formed on top of the epitaxial layer and further comprising a metal layer arranged on top of the oxide layer, wherein the metal layer is connected with the conducting material in the drain hole.

9. The field effect transistor cell structure according to claim 1, wherein the drain contact via structure is formed by a drain trench etched into the epitaxial layer filled with a conducting material.

10. The field effect transistor cell structure according to claim 9, wherein the conducting material is Tungsten.

11. The field effect transistor cell structure according to claim 1, wherein the implant shortens a depth of the drain contact.

12. A power field effect transistor (FET) comprising:
a substrate being highly doped and being of a first conductivity type;
an epitaxial layer of the first conductivity type on said substrate;
a plurality of first and second base regions of a second conductivity type arranged within said epitaxial layer and spaced apart;
a plurality of first and second source regions of a first conductivity type arranged within said first and second base region, respectively;
a plurality of gate structures insulated from said epitaxial layer by an insulation layer and arranged above the region between respective first and second base regions and covering at least partly respective first and second base regions,
a drain metal layer arranged above the epitaxial layer; and
at least one drain contact reaching from the drain metal layer into the epitaxial layer and being located in an area where the epitaxial layer extends from the substrate to the top of the device, wherein a bottom end of the drain contact which is located within the epitaxial layer is coupled with the substrate through an implant connecting only the epitaxial layer and the bottom region of the drain contact with the substrate.

13. The power FET according to claim 12, comprising a single drain contact associated with a plurality of said first and second source regions.

14. The power FET according to claim 12, wherein a plurality of drain contacts are provided and wherein a predefined ratio of a number of first and second source regions and to a respective drain contact is given.

15. The power FET according to claim 14, wherein the ratio >1.

16. The power FET according to claim 12, wherein the implant reaches into the bottom region of the drain contact via structure.

17. The power FET according to claim 12, wherein a vertical extension of the implant is larger than its horizontal extension.

18. The power FET according to claim 12, wherein the implant is a buried layer.

19. The power FET according to claim 1, wherein the drain contact is formed by a drain hole etched into the epitaxial layer filled with a conducting material.

20. The power FET according to claim 19, wherein the drain hole is etched through the epitaxial layer and an oxide layer formed on top of the epitaxial layer.

21. The power FET according to claim 1, wherein the drain contact is formed by a drain trench etched into the epitaxial layer filled with a conducting material.

22. The power field effect transistor cell structure according to claim 12, wherein the implant shortens a depth of the drain contact.

23. An integrated circuit device comprising:
a control circuit operable to generate a plurality of control signals;
at least one integrated power field effect transistor (FET) having a source, drain and a gate which is coupled with the control circuit to receive a respective control signal, comprising:
a substrate being highly doped and being of a first conductivity type;
an epitaxial layer of the first conductivity type on said substrate;
a plurality of first and second base regions of a second conductivity type arranged within said epitaxial layer and spaced apart;
a plurality of first and second source regions of a first conductivity type to form said source and arranged within said first and second base region, respectively;
a plurality of gate structures to form said gate and insulated from said epitaxial layer by an insulation layer and arranged above the region between respective first and second base regions and covering at least partly respective first and second base regions,
a drain metal layer arranged above the epitaxial layer; and
at least one drain contact reaching from the drain metal layer into the epitaxial layer and being located in an area where the epitaxial layer extends from the substrate to the top of the device, wherein the drain contact comprises a first section comprising conductive material reaching from a top of the device into the epitaxial layer and a second section formed by an implant between the first section and reaching into the substrate wherein the implant shortens a depth of the first section comprising the conductive material, wherein the implant only connects said substrate and said epitaxial layer with the drain contact.

* * * * *